United States Patent
Urushido

(10) Patent No.: US 7,119,423 B2
(45) Date of Patent: Oct. 10, 2006

(54) SEMICONDUCTOR DEVICE AND METHOD OF MANUFACTURING THE SAME, ELECTRONIC MODULE, AND ELECTRONIC INSTRUMENT

(75) Inventor: Tatsuhiro Urushido, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/994,403

(22) Filed: Nov. 23, 2004

(65) Prior Publication Data
US 2005/0133889 A1  Jun. 23, 2005

(30) Foreign Application Priority Data
Nov. 28, 2003  (JP)  ............... 2003-399135

(51) Int. Cl.
*H01L 23/495* (2006.01)
*H01L 23/48* (2006.01)

(52) U.S. Cl. ............... 257/666; 257/668; 257/672; 257/692; 257/694; 257/696; 257/734; 257/780; 257/781; 257/784; 257/E23.066; 257/E23.042; 257/E23.06; 257/926; 257/673; 257/674

(58) Field of Classification Search ............ 257/666, 257/926, 668, 696, 672–674, 692, 694, 734, 257/780, 781, 784, E33.066, E23.042, E23.06
See application file for complete search history.

(56) References Cited

U.S. PATENT DOCUMENTS
6,867,490 B1 * 3/2005 Toyosawa ............ 257/692

FOREIGN PATENT DOCUMENTS
| JP | A 07-235564 | 9/1995 |
| JP | A 07-273119 | 10/1995 |
| JP | A-2004-193223 | 7/2004 |

OTHER PUBLICATIONS

U.S. Appl. No. 10/996,471, filed Nov. 26, 2004, Urushido.
U.S. Appl. No. 10/996,472, filed Nov. 26, 2004, Urushido.

* cited by examiner

*Primary Examiner*—Jasmine Clark
(74) *Attorney, Agent, or Firm*—Oliff & Berridge, PLC

(57) ABSTRACT

A semiconductor chip is mounted on the substrate so that the first group of electrodes faces the first group of leads and the second group of electrodes faces the second group of leads. The first group of leads extends in a direction away from the second group of electrodes. Each of the second group of leads extends so as to pass between the first group of electrodes and is formed to be bent in the region between first and second straight lines.

6 Claims, 4 Drawing Sheets

SEMICONDUCTOR DEVICE AND METHOD OF MANUFACTURING THE SAME, ELECTRONIC MODULE, AND ELECTRONIC INSTRUMENT

Japanese Patent Application No. 2003-399135, filed on Nov. 28, 2003, is hereby incorporated by reference in its entirety.

BACKGROUND OF THE INVENTION

The present invention relates to a semiconductor device and a method of manufacturing the same, an electronic module, and an electronic instrument.

In a chip-on-film (COF) mounting form, a semiconductor chip is mounted on a substrate. Since the substrate and the semiconductor chip differ in coefficient of thermal expansion, a lead formed on the substrate may be bent due to force applied to the joint section with an electrode of the semiconductor chip by this difference in coefficient of thermal expansion. When the gap between adjacent electrodes of the semiconductor chip is narrow, it is difficult to prevent the lead from coming in contact with the electrode adjacent to the electrode to which the lead is bonded.

BRIEF SUMMARY OF THE INVENTION

A semiconductor device according to a first aspect of the present invention includes:

a substrate on which first and second groups of leads are formed; and a semiconductor chip which includes first and second groups of electrodes arranged respectively on both sides of a region between first and second parallel straight lines;

wherein the semiconductor chip is mounted on the substrate so that the first group of electrodes faces the first group of leads and the second group of electrodes faces the second group of leads, wherein the first group of leads extends in a direction away from the second group of electrodes, and wherein each of the second group of leads extends so as to pass between the first group of electrodes and is formed to be bent in the region between first and second straight lines.

An electronic module according to a second aspect of the present has the above semiconductor device attached thereto.

An electronic instrument according to a third aspect of the present invention has the above semiconductor device.

A method of manufacturing a semiconductor device according to a fourth aspect of the present invention includes:

(a) heating and expanding a substrate on which first and second groups of leads are formed and a semiconductor chip which includes first and second groups of electrodes arranged respectively on both sides of a region between first and second parallel straight lines;

(b) bonding each of the first group of electrodes to one of the first group of leads, and bonding each of the second group of electrodes to a first portion of one of the second group of leads; and (c) causing the semiconductor chip and the substrate to release heat and shrink;

wherein, before the step (b), each of the second group of leads further includes a bent portion extending from the first portion and a second portion extending from the bent portion, at least the second portion adhering to the substrate, wherein, in the step (b), the first group of leads is disposed so as to extend from joint sections with the first group of electrodes in a direction opposite to the second group of electrodes, and each of the second group of leads is disposed so that the first portion faces one of the second group of electrodes, the bent portion is disposed in the region between the first and second straight lines, and the second portion passes between the first group of electrodes, and wherein the step (c) includes:

($c_1$) causing the semiconductor chip to shrink at a percentage greater than a percentage of the substrate, and causing the bent portion to be deformed by applying force in a shrinkage direction to the bent portion through the first portion bonded to one of the second group of electrodes by the shrinkage force; and ($c_2$) causing the substrate to shrink at a percentage greater than a percentage of the semiconductor chip, and causing the bent portion to be deformed by applying force in a shrinkage direction to the second portion adhering to the substrate by the shrinkage force.

DETAILED DESCRIPTION OF THE EMBODIMENT

Figure 1:
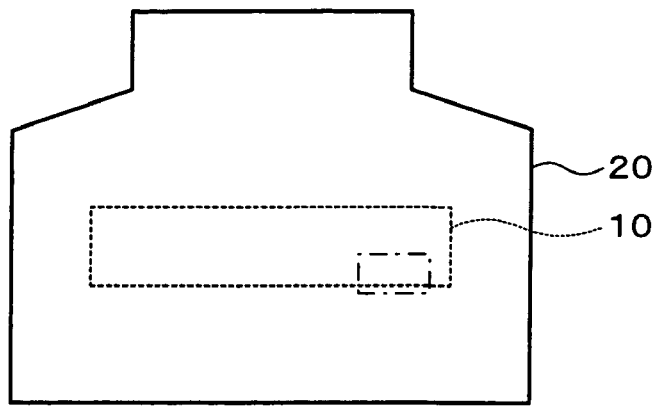
FIG. 1 is illustrative of a semiconductor device according to an embodiment of the present invention.

Embodiments of the present invention can prevent a lead from coming in contact with an electrode.

(1) A semiconductor device according to an embodiment of the present invention includes:

a substrate on which first and second groups of leads are formed; and a semiconductor chip which includes first and second groups of electrodes arranged respectively on both sides of a region between first and second parallel straight lines;

wherein the semiconductor chip is mounted on the substrate so that the first group of electrodes faces the first group of leads and the second group of electrodes faces the second group of leads, wherein the first group of leads extends in a direction away from the second group of electrodes, and wherein each of the second group of leads extends so as to pass between the first group of electrodes and is formed to be bent in the region between first and second straight lines.

According to this embodiment, since each of the second group of leads is bent, the bent portion is more easily bent. Since the bent portion is located in the region between the first and second straight lines and this region is between the first and second groups of electrodes, the lead rarely comes in contact with the electrode even if the lead is bent. This prevents the lead from coming in contact with the electrode.

(2) With this semiconductor device, at least a portion of each of the second group of leads which may overlap the semiconductor chip adheres to the substrate.

(3) With this semiconductor device, one of the second group of leads may extend on a side of each of the first group of leads, which is in a direction of a closer end of the semiconductor chip among two ends of the semiconductor chip crossing the first and second straight lines, so as to be bent in a direction towards the closer end in the region between the first and second straight lines.

(4) With this semiconductor device, the second group of leads may be formed so that two or more of the second group of leads pass between an adjacent pair of the first group of electrodes, and a pair of outermost leads of the two or more of the second leads may extend in the region between the first and second straight lines so as to be bent in a direction in which each of the pair of outermost leads comes closer to each other.

(5) An electronic module according to another embodiment of the present invention has the above semiconductor device attached thereto.

(6) An electronic instrument according to a further embodiment of the present invention has the above semiconductor device.

(7) A method of manufacturing a semiconductor device according to a still further embodiment of the present invention includes:

(a) heating and expanding a substrate on which first and second groups of leads are formed and a semiconductor chip which includes first and second groups of electrodes arranged respectively on both sides of a region between first and second parallel straight lines;

(b) bonding each of the first group of electrodes to one of the first group of leads, and bonding each of the second group of electrodes to a first portion of one of the second group of leads; and (c) causing the semiconductor chip and the substrate to release heat and shrink;

wherein, before the step (b), each of the second group of leads further includes a bent portion extending from the first portion and a second portion extending from the bent portion, at least the second portion adhering to the substrate, wherein, in the step (b), the first group of leads is disposed so as to extend from joint sections with the first group of electrodes in a direction opposite to the second group of electrodes, and each of the second group of leads is disposed so that the first portion faces one of the second group of electrodes, the bent portion is disposed in the region between the first and second straight lines, and the second portion passes between the first group of electrodes, and wherein the step (c) includes:

($c_1$) causing the semiconductor chip to shrink at a percentage greater than a percentage of the substrate, and causing the bent portion to be deformed by applying force in a shrinkage direction to the bent portion through the first portion bonded to one of the second group of electrodes by the shrinkage force; and ($c_2$) causing the substrate to shrink at a percentage greater than a percentage of the semiconductor chip, and causing the bent portion to be deformed by applying force in a shrinkage direction to the second portion adhering to the substrate by the shrinkage force.

According to this embodiment, each of the second group of leads includes the bent portion, and the bent portion is further bent by shrinkage of the substrate and the semiconductor chip. Since the bent portion is located in the region between the first and second straight lines and this region is between the first and second groups of electrodes, the bent portion rarely comes in contact with the electrode even if the bent portion is further bent. This prevents the lead from coming in contact with the electrode.

(8) With this method of manufacturing a semiconductor device, in the step (b), the bent portion of one of the second group of leads may be bent on a side of each of the first group of leads, which is in a direction of a closer end of the semiconductor chip among two ends of the semiconductor chip crossing the first and second straight lines, from the first portion toward the second portion in a direction toward the closer end.

(9) With this method of manufacturing a semiconductor device, before the step (b), a pair of outermost leads of two or more of the second group of leads may be bent in the bent portion from the first portion toward the second portion in a direction in which each of the pair of outermost leads comes closer to each other, and in the step (b), the two or more of the second group of leads may be disposed to pass between an adjacent pair of the first group of electrodes.

Embodiments of the present invention are described below with reference to the drawings.

Figure 2:
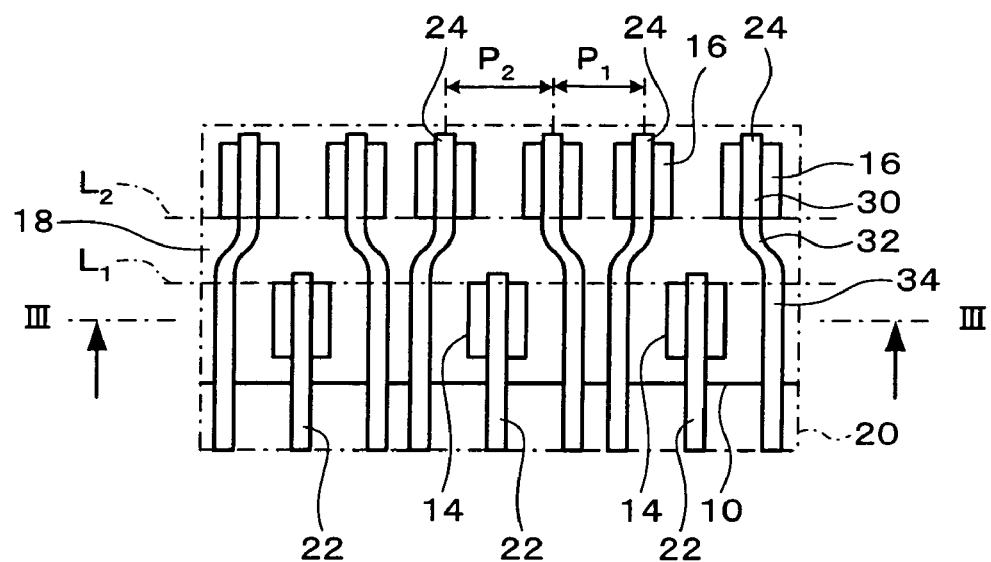
FIG. 2 is an enlarged view of the semiconductor device shown in FIG. 1 in the area enclosed by a dash-dotted line.
Figure 3:
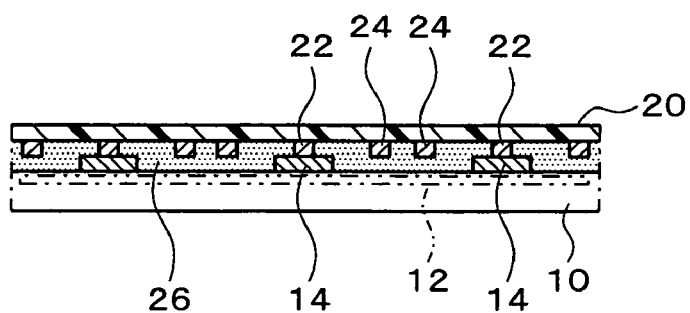
FIG. 3 is a cross-sectional view of the semiconductor device shown in FIG. 2 along the line III—III.

FIG. 1 is a view illustrating a semiconductor device according to an embodiment of the present invention. FIG. 2 is an enlarged view of the semiconductor device shown in FIG. 1 in the area enclosed by the dash-dotted line, and FIG. 3 is a cross-sectional view of the semiconductor device shown in FIG. 2 along the line III—III.

The semiconductor device includes a semiconductor chip 10. The semiconductor chip 10 may have a shape having a rectangular surface (rectangular parallelepiped). An integrated circuit 12 is formed in the semiconductor chip 10. A passivation film (electrical insulating film) (not shown) may be formed to cover the integrated circuit 12.

The semiconductor chip 10 includes a first group of electrodes 14 arranged along a first straight line $L_1$. The first group of electrodes 14 is arranged in a line. The first straight line $L_1$ may be a straight line parallel to the edge of the semiconductor chip 10 (long side of the rectangular surface, for example). The first group of electrodes 14 may be arranged between the first straight line $L_1$ and the edge of the semiconductor chip 10. The first group of electrodes 14 may be arranged at a uniform pitch.

The semiconductor chip 10 includes a second group of electrodes 16 arranged along a second straight line $L_2$. The second group of electrodes 16 is arranged in a line. The second straight line $L_2$ may be a straight line parallel to the edge of the semiconductor chip 10 (long side of the rectangular surface, for example). The second straight line $L_2$ may be located closer to the center of the semiconductor chip 10 than the first straight line $L_1$. The second group of electrodes 16 may be arranged in one of a pair of regions divided by the second straight line $L_2$ which is closer to the center of the semiconductor chip 10. The second group of electrodes 16 may be arranged at a nonuniform pitch. As shown in FIG. 2, the second group of electrodes 16 may be arranged so that the pitches between the adjacent electrodes are $P_1$ and $P_2$ ($P_1<P_2$), for example. When the second group of electrodes 16 is divided into units of two or more (two in FIG. 2) electrodes, the pitch between two or more divided electrodes is $P_1$, and the pitch between two or more divided electrodes and the adjacent electrode is $P_2$.

The first and second straight lines $L_1$ and $L_2$ extend in parallel. The first and second groups of electrodes 14 and 16 are disposed on each side of a region 18 between the first and second straight lines $L_1$ and $L_2$. Each of the first and second groups of electrodes 14 and 16 may consist of a pad and a bump formed on the pad, and may be formed of a metal such as gold or silver. The first and second groups of electrodes 14 and 16 are electrically connected with the inside of the semiconductor chip 10, and two or more electrodes (all or some of the electrodes) of the first and second groups of electrodes 14 and 16 are electrically connected with the integrated circuit 12. The first and second groups of electrodes 14 and 16 are formed to be exposed from the passivation film (not shown).

The semiconductor device includes a substrate 20. The substrate 20 may be a film or a plate. The substrate 20 is formed of a material having a coefficient of thermal expansion (coefficient of linear expansion, for example) greater than that of the semiconductor chip 10. The substrate 20 may have low heat-sink properties due to thermal conductivity lower than that of the semiconductor chip 10 or the like. The substrate 20 may be formed of a resin such as a polyimide resin, or may be formed of a mixed material of an organic material such as a resin and an inorganic material.

The semiconductor chip 10 is mounted on the substrate 20. The mounting form of the semiconductor chip 10 may be a chip-on-film (COF). The second surface of the semiconductor chip 10 having the first and second groups of electrodes 14 and 16 faces the substrate 20.

A first group of leads 22 is formed on the substrate 20. The first group of leads 22 (part of the lead 22) faces the first group of electrodes 14 (part of the electrode 14), and may be bonded to the first group of electrodes 14. The bonding not only includes bonding in which a metal eutectic consisting of the materials for the lead 22 and the electrode 14 is formed, but also includes bonding in which conductive particles are present between the lead 22 and the electrode 14. The first group of leads 22 extends in the direction which intersects (at right angles, for example) the first straight line $L_1$ along which the first group of electrodes 14 is arranged. The first group of leads 22 extends in the direction away from the second group of electrodes 16 (or the second straight line $L_2$).

A second group of leads 24 is formed on the substrate 20. The second group of leads 24 (part of the lead 24) faces the second group of electrodes 16 (part of the electrode 16), and may be bonded to the second group of electrodes 16. The bonding not only includes bonding in which a metal eutectic consisting of the materials for the lead 24 and the electrode 16 is formed, but also includes bonding in which conductive particles are present between the lead 24 and the electrode 16. The second group of leads 24 extends in the direction which intersects (at right angles, for example) the second straight line $L_2$ along which the second group of electrodes 16 is arranged. The second group of leads 24 extends from the second group of electrodes 16 in the direction closer to the first straight line $L_1$, and intersects the first straight line $L_1$.

The second group of leads 24 individually extends to pass between the first group of electrodes 14 (or first group of leads 22). In more detail, the second group of leads 24 is formed so that two or more (two in FIG. 2) of leads 24 pass between a pair of adjacent electrodes 14 of the first group of electrodes 14.

The second group of leads 24 is formed to be bent in the region 18 between the first and second straight lines $L_1$ and $L_2$. The bending may be in a shape which is bent so as not to have a corner. Since the second group of leads 24 does not have a corner, stress does not concentrate locally even if the second group of leads 24 is deformed. Therefore, the second group of leads 24 rarely breaks. The second group of leads 24 may be formed linearly (so as not to be bent) on design (before bonding to the electrode 16) excluding the area inside the region 18 between the first and second straight lines $L_1$ and $L_2$.

In FIG. 2, one of the second group of leads 24 extends on the right of one of the first group of leads 22 so as to be bent in the rightward direction (see FIG. 1) of the semiconductor chip 10 in the region 18. In general, one of the second group of leads 24 extends on the side of one of the first group of leads 22 (side in the direction of the closer end of the semiconductor chip 10 crossing the first and second straight lines $L_1$ and $L_2$) so as to be bent in the direction of the closer end of the semiconductor chip 10 in the region 18 between the first and second straight lines $L_1$ and $L_2$. A pair of the outermost leads (two leads 24 in the example shown in FIG. 2) among two or more of the second group of leads 24 extends so as to be bent in the direction in which the pair of leads 24 comes closer in the region 18 between the first and second straight lines $L_1$ and $L_2$.

At least either the first or second group of leads 22 or 24 is formed of a metal such as copper. The first group of leads 22 (or second group of leads 24) may entirely adhere to the substrate 20, or may adhere to the substrate 20 at least in the area in which the lead 22 overlaps the substrate 20. The adhesion not only includes attachment through an adhesive, but also includes the case where the lead 22 directly adheres to the substrate 20.

As shown in FIG. 3, a resin (underfill material or adhesive) 26 may be provided between the semiconductor chip 10 and the substrate 20. The resin 26 may cause the first and second groups of electrodes 14 and 16 and the first and second groups of leads 22 and 24 to come in contact by pressure due to shrinkage force. The resin 26 may disperse or absorb the stress produced by the difference in coefficient of thermal expansion between the semiconductor chip 10 and the substrate 20. If the second group of leads 24 is bent so as not to have a corner, a precursor (liquid or paste) of the resin 26 exhibits good flowability or filling capability when providing the resin 26.

A method of manufacturing the semiconductor device according to this embodiment is described below. In this embodiment, the above-described semiconductor chip 10 and the substrate 20 are provided. As shown in FIG. 2, each of the second group of leads 24 includes a first portion 30, a bent portion 32 which extends from the first portion 30, and a second portion 34 which extends from the bent portion 32. At least the second portion 34 (or entirety) of each of the second group of leads 24 adheres (adheres through an adhesive or directly adheres, for example) to the substrate 20. The lead 24 has this feature before performing bonding and heating steps described later. A pair of the outermost leads 24 among two or more of the second group of leads 24 may be bent in the bent portion 32 from the first portion 30 toward the second portion 34 in the direction in which the pair of leads 24 comes closer.

In this embodiment, the semiconductor chip 10 and the substrate 20 are heated. The heating may be performed to cure a thermosetting adhesive which bonds the semiconductor chip 10 and the substrate 20, or may be performed to bond the first and second groups of electrodes 14 and 16 and the first and second groups of leads 22 and 24, or may be performed for both of these purposes. The semiconductor chip 10 and the substrate 20 expand by heating.

In this embodiment, one of the first group of electrodes 14 (part of the electrode 14) is bonded to one of the first group of leads 22 (part of the lead 22). One of the second group of electrodes 16 (part of the electrode 16) is bonded to the first portion 30 of one of the second group of leads 24 (see FIG. 2). The bonding may be performed with heating. Preliminary heating may be performed before the bonding, and the bonding may be performed with main heating.

The first group of leads 22 is disposed at the time of bonding so as to extend from the joint sections with the first group of electrodes 14 in the direction opposite to the second group of electrodes 16. The first portion 30 of each of the second group of leads 24 faces one of the second group of electrodes 16. The bent portion 32 of each of the second group of leads 24 is disposed in the region 18 between the first and second straight lines $L_1$ and $L_2$. The second portion 34 of each of the second group of leads 24 passes between the first group of electrodes 14.

The bent portion 32 of one of the second group of leads 24 is bent in the direction of the closer end of the semiconductor chip 10 (rightward direction in FIGS. 1 and 2) from the first portion 30 toward the second portion 34 on the side of one of the first group of leads 22 in the direction of the closer end of the semiconductor chip 10 crossing the first and second straight lines $L_1$ and $L_2$ (rightward direction in FIGS. 1 and 2). Two or more of the second group of leads 24 are disposed to pass between an adjacent pair of the first group of electrodes 14. The above description relating to the configuration applies to other details.

The semiconductor device according to this embodiment may be manufactured by the method including the above process. When the semiconductor chip 10 and the substrate 20 differ in the coefficient of thermal expansion (coefficient of linear expansion, for example), the method of manufacturing the semiconductor device may further include causing the semiconductor chip 10 and the substrate 20 to release heat and shrink.

Figure 4:
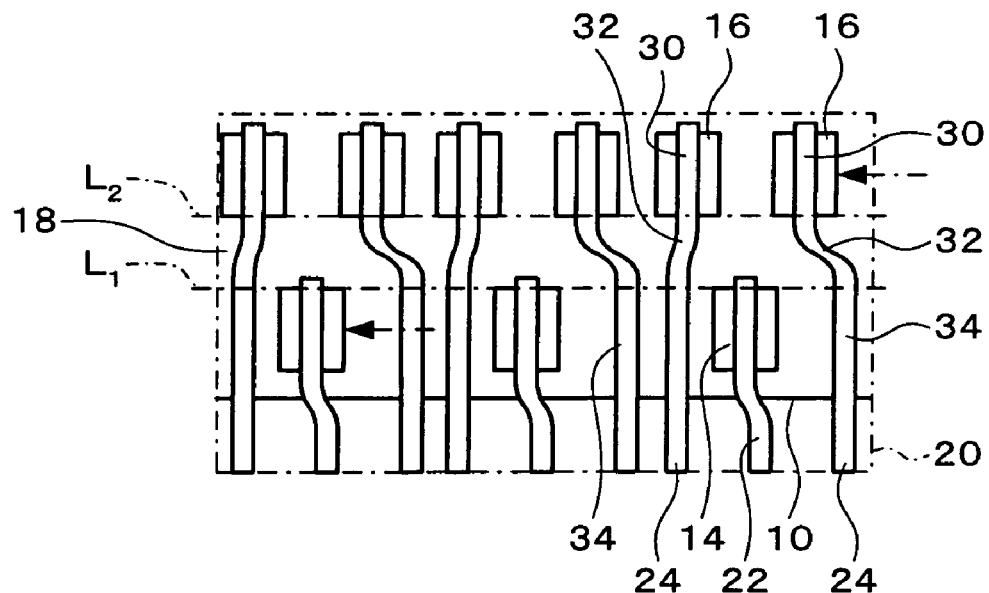
FIG. 4 is illustrative of a process of causing a semiconductor chip and a substrate to release heat and shrink in an embodiment of the present invention.
Figure 5:
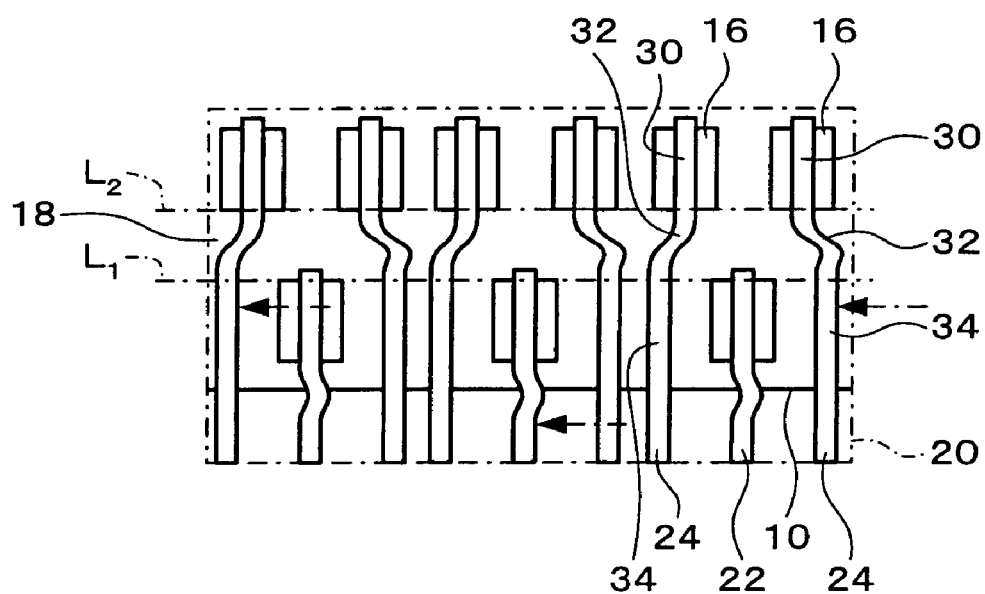
FIG. 5 is illustrative of another process of causing a semiconductor chip and a substrate to release heat and shrink in an embodiment of the present invention.

FIGS. 4 and 5 are views illustrating a process of causing the semiconductor chip 10 and the substrate 20 to release heat and shrink in an embodiment of the present invention. The substrate 20 is formed of a material having a coefficient of linear expansion greater than that of the semiconductor chip 10. For example, the substrate 20 is formed of a resin, and the semiconductor chip 10 is mainly formed of silicon. The semiconductor chip 10 has heat-sink properties higher than those of the substrate 20.

In this embodiment, the semiconductor chip 10 is caused to shrink at a percentage greater than that of the substrate 20. The shrinkage may be caused to occur by causing the semiconductor chip 10 to release heat (or to be cooled) before the substrate 20 when the heat-sink properties of the semiconductor chip 10 are higher than those of the substrate 20.

As shown in FIG. 4, the bent portion 32 is deformed by applying force in the shrinkage direction to the bent portion 32 by the shrinkage force through the first portion 30 bonded to one of the second group of electrodes 16. The force in the shrinkage direction is the force in the direction from each end to the center of the semiconductor chip 10. Specifically, force in the direction from the end (closer end of the semiconductor chip 10 crossing the first and second straight lines $L_1$ and $L_2$ in more detail) of the semiconductor chip 10 to the center of the semiconductor chip 10 is applied to the first portion 30. Therefore, since the first portion 30 moves in the direction from the end to the center of the semiconductor chip 10 with respect to the second portion 34 which continues from the first portion 30 through the bent portion 32, the bent portion 32 is deformed accompanying this movement.

In FIG. 4, each of the second group of leads 24 located on the right of one of the first group of leads 22 (side of the lead 22 in the direction of the closer end of the semiconductor chip 10 crossing the first and second straight lines $L_1$ and $L_2$ in general) is deformed so that the bent portion 32 is bent to a greater extent.

In FIG. 4, each of the second group of leads 24 located on the left of one of the first group of leads 22 (side of the of the lead 22 in the direction of the farther end of the semiconductor chip 10 crossing the first and second straight lines $L_1$ and $L_2$ in general) is deformed so that the bent portion 32 is bent to a smaller extent.

Each of the first group of leads 22 may be deformed by applying force in the shrinkage direction, through the joint section with one of the first group of electrodes 14, to the section of each of the first group of leads 22 extending from the joint section by the shrinkage force. Each of the first group of leads 22 is bent from the electrode 14 in the direction of the end (closer end of the semiconductor chip 10 crossing the first and second straight lines $L_1$ and $L_2$ in more detail) of the semiconductor chip 10.

The substrate 20 is caused to shrink at a percentage greater than that of the semiconductor chip 10. The shrinkage may be caused to occur by causing the semiconductor chip 10 to release heat (or to be cooled) after the semiconductor chip 10 has shrunk when the heat-sink properties of the semiconductor chip 10 are higher than those of the substrate 20.

As shown in FIG. 5, the bent portion 32 is deformed by applying force in the shrinkage direction to the second portion 34 adhering to the substrate 20 by the shrinkage force. The force in the shrinkage direction is the force in the direction from each end to the center of the substrate 20. Specifically, force in the direction from the end (closer end of the substrate 20 crossing the first and second straight lines $L_1$ and $L_2$ in more detail) of the substrate 20 to the center of the substrate 20 is applied to the second portion 34. Therefore, since the second portion 34 moves in the direction from the end to the center of the substrate 20 with respect to the first portion 30 which continues from the second portion 34 through the bent portion 32, the bent portion 32 is deformed accompanying this movement.

In FIG. 5, each of the second group of leads 24 located on the right of one of the first group of leads 22 (side of the of the lead 22 in the direction of the closer end of the substrate 20 crossing the first and second straight lines $L_1$ and $L_2$) is deformed so that the bent portion 32 is bent in the recovery direction. As a result, a projecting section (or projection) in the rightward direction (direction of the closer end of the substrate 20 crossing the first and second straight lines $L_1$ and $L_2$ in general) of each of the first group of leads 22 may be formed in the bent portion 32.

In FIG. 5, each of the second group of leads 24 located on the left of one of the first group of leads 22 (side of the of the lead 22 in the direction of the farther end of the substrate 20 crossing the first and second straight lines $L_1$ and $L_2$ in general) is deformed so that the bent portion 32 is bent to a greater extent.

Each of the first group of leads 22 may be deformed by applying force in the shrinkage direction, through the joint section with one of the first group of electrodes 14, to the section of each of the first group of leads 22 extending from the joint section by the shrinkage force. The section of each of the first group of leads 22 which has been bent by the above-described process (see FIG. 4) is deformed in the recovery direction. As a result, a projecting section (or projection) in the rightward direction (direction of the closer end of the substrate 20 crossing the first and second straight lines $L_1$ and $L_2$ in general) of each of the first group of leads 22 may be formed in the bent portion.

The semiconductor device according to the present invention may include a structure obtained by the above-described process. The method of manufacturing the semiconductor device according to this embodiment may include a process which can be derived from the description of the above-described semiconductor device.

According to this embodiment, since each of the second group of leads 24 is bent, the bent portion 32 is more easily bent. Since the bent portion 32 is located in the region 18 between the first and second straight lines $L_1$ and $L_2$ and the region 18 is a region between the first and second groups of electrodes 14 and 16, the lead 24 rarely comes in contact with the electrodes 14 and 16 even if the lead 24 is bent. This prevents the lead 24 from coming in contact with the electrodes 14 and 16.

Modification

Figure 6:
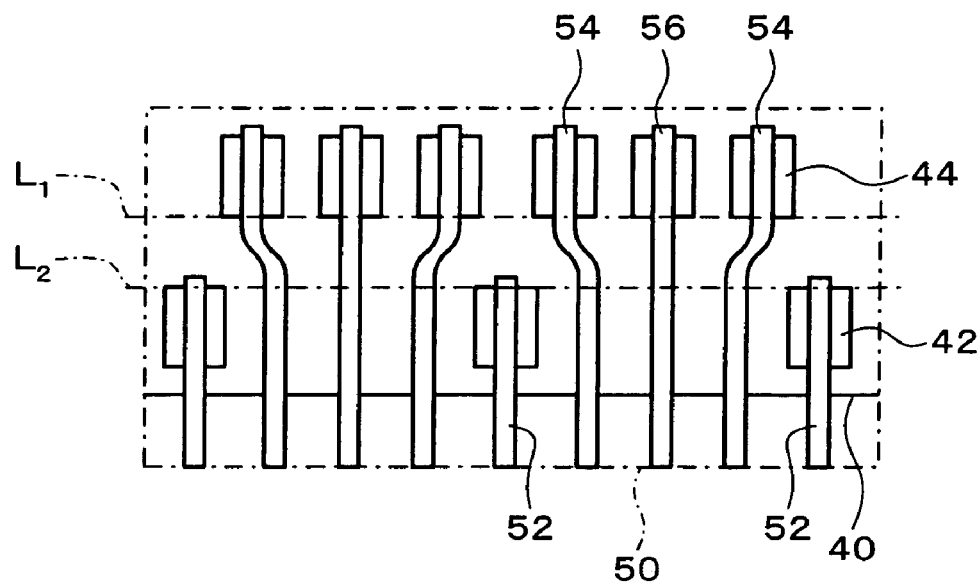
FIG. 6 is illustrative of a first modification of a semiconductor device according to an embodiment of the present invention.

FIG. 6 is a view illustrating a first modification of a semiconductor device according to an embodiment of the present invention. A semiconductor chip 40 includes first and second groups of electrodes 42 and 44 (description of the above-described first and second groups of electrodes 14 and 16 respectively applies to the first and second groups of electrodes 42 and 44). A substrate 50 includes first and second groups of leads 52 and 54 (description of the above-described first and second groups of leads 22 and 24 respectively applies to the first and second groups of leads 52 and 54). In this modification, at least one (one in FIG. 6) lead 56 is arranged between a pair of the second group of leads 54. The lead 56 may extend linearly. The description given in the above-described embodiment applies to the semiconductor device according to this modification relating to other details.

In this modification, the leads 52, 54, and 56 may be deformed by applying the description given with reference to FIGS. 4 and 5. The description of deformation of the lead 22 given with reference to FIGS. 4 and 5 applies to deformation of the lead 56.

Figure 7:
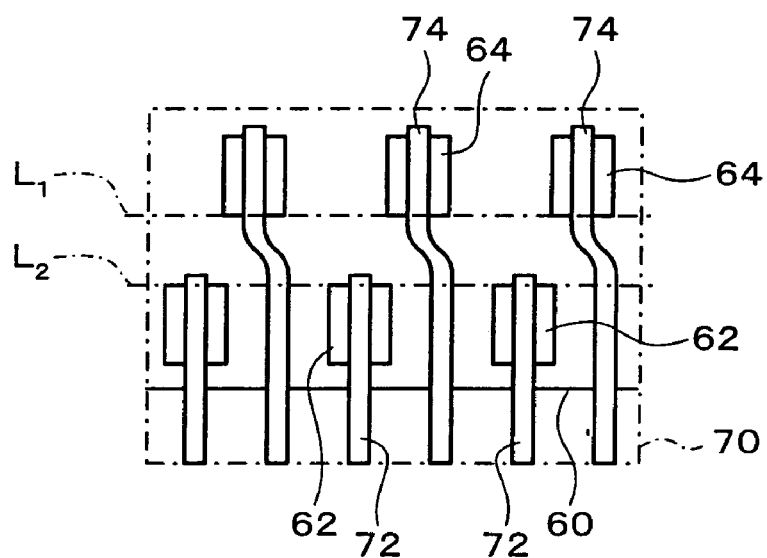
FIG. 7 is illustrative of a second modification of a semiconductor device according to an embodiment of the present invention.

FIG. 7 is a view illustrating a second modification of a semiconductor device according to an embodiment of the present invention. A semiconductor chip 60 includes first and second groups of electrodes 62 and 64 (description of the above-described first and second groups of electrodes 14 and 16 respectively applies to the first and second groups of electrodes 62 and 64). However, the first and second groups of electrodes 62 and 64 are disposed in a staggered arrangement. A substrate 70 includes a first group of leads 72 (description of the above-described first group of leads 22 applies to the first group of leads 72).

The substrate 70 includes a second group of leads 74 (description of the above-described second group of leads 24 applies to the second group of leads 74). One lead 74 is arranged between a pair of the leads 72, and one lead 72 is arranged between a pair of the leads 74. The lead 74 is bent. The description of the lead 24 given with reference to FIG. 2 applies to the details of lead 74. However, in this modification, all the leads 24 extend so as to be bent in the direction of the closer end of the semiconductor chip 10 crossing the first and second straight lines $L_1$ and $L_2$. This feature differs from FIG. 2 in which two leads 24 between a pair of leads 22 come closer. The description given in the above-described embodiment applies to the semiconductor device according to this modification relating to other details.

In this modification, the leads 72 and 74 may be deformed by applying the description given with reference to FIGS. 4 and 5. The description of deformation of the lead 22 given with reference to FIGS. 4 and 5 applies to deformation of the lead 72. The description of deformation of the lead 24 located on the right of the lead 22 (side of each of the first group of leads 22 in the direction of the closer end of the semiconductor chip 10 crossing the first and second straight lines $L_1$ and $L_2$ in general) applies to deformation of the lead 74.

Figure 8:
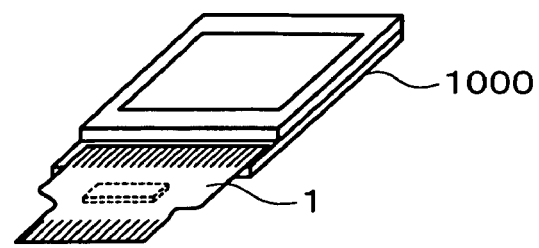
FIG. 8 shows an electric module to which a semiconductor device according to an embodiment of the present invention is attached.
Figure 9:
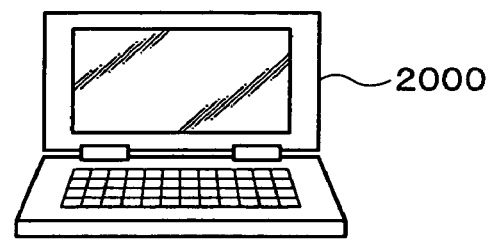
FIG. 9 shows an electronic instrument including a semiconductor device according to an embodiment of the present invention.
Figure 10:
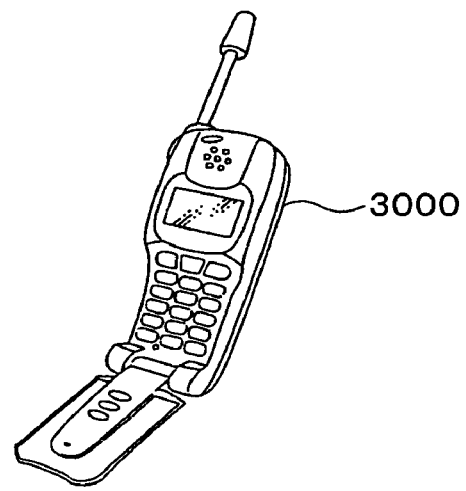
FIG. 10 shows another electronic instrument including a semiconductor device according to an embodiment of the present invention.

FIG. 8 shows an electronic module (liquid crystal module, for example) 1000 to which a semiconductor device 1 described in the above-described embodiment is attached. FIGS. 9 and 10 respectively show a notebook-type personal computer 2000 and a portable telephone 3000 as electronic instruments including this semiconductor device.

Although only some embodiments of the present invention have been described in detail above, those skilled in the art will readily appreciate that many modifications are possible in the embodiments without materially departing from the novel teachings and advantages of this invention. Accordingly, all such modifications are intended to be included within scope of this invention.

What is claimed is:

1. A semiconductor device comprising:
    a substrate on which first and second groups of leads are formed; and
    a semiconductor chip which includes first and second groups of electrodes arranged respectively on both sides of a region between first and second parallel straight lines,
    wherein the semiconductor chip is mounted on the substrate so that the first group of electrodes faces the first group of leads and the second group of electrodes faces the second group of leads,
    wherein the first group of leads extends in a direction away from the second group of electrodes, and
    wherein each of the second group of leads extends so as to pass between the first group of electrodes and is formed to be bent in the region between first and second straight lines.

2. The semiconductor device as defined in claim 1,
    wherein at least a portion of each of the second group of leads which overlaps the semiconductor chip adheres to the substrate.

3. The semiconductor device as defined in claim 1,
    wherein one of the second group of leads extends on a side of each of the first group of leads, which is in a direction of a closer end of the semiconductor chip among two ends of the semiconductor chip crossing the first and second straight lines, so as to be bent in a direction towards the closer end in the region between the first and second straight lines.

4. The semiconductor device as defined in claim 1,
wherein the second group of leads is formed so that two or more of the second group of leads pass between an adjacent pair of the first group of electrodes, and
wherein a pair of outermost leads of the two or more of the second leads extends in the region between the first and second straight lines so as to be bent in a direction in which each of the pair of outermost leads comes closer to each other.

5. An electronic module to which the semiconductor device as defined in claim 1 is attached.

6. An electronic instrument comprising the semiconductor device as defined in claim 1.

* * * * *